US011245009B2

(12) United States Patent
Reznicek et al.

(10) Patent No.: US 11,245,009 B2
(45) Date of Patent: Feb. 8, 2022

(54) ASYMMETRIC CHANNEL FINFETS WITH WRAP AROUND CHANNEL

(71) Applicant: INTERNATIONAL BUSINESS MACHINES CORPORATION, Armonk, NY (US)

(72) Inventors: Alexander Reznicek, Troy, NY (US); Jingyun Zhang, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 52 days.

(21) Appl. No.: 16/849,202

(22) Filed: Apr. 15, 2020

(65) Prior Publication Data

US 2021/0328017 A1    Oct. 21, 2021

(51) Int. Cl.
| | | |
|---|---|---|
| *H01L 29/10* | (2006.01) | |
| *H01L 29/78* | (2006.01) | |
| *H01L 29/08* | (2006.01) | |
| *H01L 29/167* | (2006.01) | |
| *H01L 29/165* | (2006.01) | |
| *H01L 21/02* | (2006.01) | |
| *H01L 29/66* | (2006.01) | |

(52) U.S. Cl.
CPC .... *H01L 29/1037* (2013.01); *H01L 21/02532* (2013.01); *H01L 29/0847* (2013.01); *H01L 29/165* (2013.01); *H01L 29/167* (2013.01); *H01L 29/6653* (2013.01); *H01L 29/6656* (2013.01); *H01L 29/66545* (2013.01); *H01L 29/66553* (2013.01); *H01L 29/66795* (2013.01); *H01L 29/7851* (2013.01)

(58) Field of Classification Search
CPC ............... H01L 29/1037; H01L 29/167; H01L 21/02532; H01L 29/165; H01L 29/6653; H01L 29/7851; H01L 29/66553; H01L 29/0847; H01L 29/6656; H01L 29/66545; H01L 29/66795

See application file for complete search history.

(56) References Cited

U.S. PATENT DOCUMENTS 8,067,287 B2    11/2011    Baumgartner
8,237,197 B2     8/2012    Chen et al.
(Continued)

OTHER PUBLICATIONS

Baek, K. J. et al., "Device Optimization of N-Channel MOSFETs with Lateral Asymmetric Channel Doping Profiles" Transactions on Electrical and Electronic Materials (Feb. 2010) pp. 15-19, vol. 11, No. 1.
(Continued)

*Primary Examiner* — Karen Kusumakar
*Assistant Examiner* — Adam S Bowen
(74) *Attorney, Agent, or Firm* — Tutunjian & Bitetto, P.C.; Jeffrey S. LaBaw

(57) ABSTRACT

A semiconductor device that includes a fin structure, and a channel epitaxial wrap around layer at each end of a channel portion of the fin structure. The semiconductor device also includes a gate structure including a gate dielectric having gate edge portions in direct contact with the channel epitaxial wrap around layer. A middle portion of the gate dielectric is in direct contact with a central channel portion of the fin structure between the two ends of the channel portion of the fin structure. Source and drain regions are present on opposing sides of the channel portion of the fin structure.

20 Claims, 10 Drawing Sheets

(56) References Cited

U.S. PATENT DOCUMENTS

| | | |
|---|---|---|
| 8,263,446 B2 | 9/2012 | Cheng et al. |
| 8,637,871 B2 | 1/2014 | Anderson et al. |
| 8,901,619 B2 | 12/2014 | Cheng et al. |
| 9,287,360 B1 | 3/2016 | Basu et al. |
| 9,437,738 B2 | 9/2016 | Lin |
| 9,859,423 B2 | 1/2018 | Liu et al. |
| 2017/0154995 A1* | 6/2017 | Ontalus ............. H01L 29/41783 |
| 2020/0098866 A1* | 3/2020 | Lu .................... H01L 21/28185 |

OTHER PUBLICATIONS

Narasimhulu, K. et al., "Impact of Lateral Asymmetric Channel Doping on Deep Submicrometer Mixed-Signal Device and Circuit Performance" IEEE Transaction on Electron Devices (Dec. 2003) pp. 2481-2489, vol. 50, No. 12.

* cited by examiner

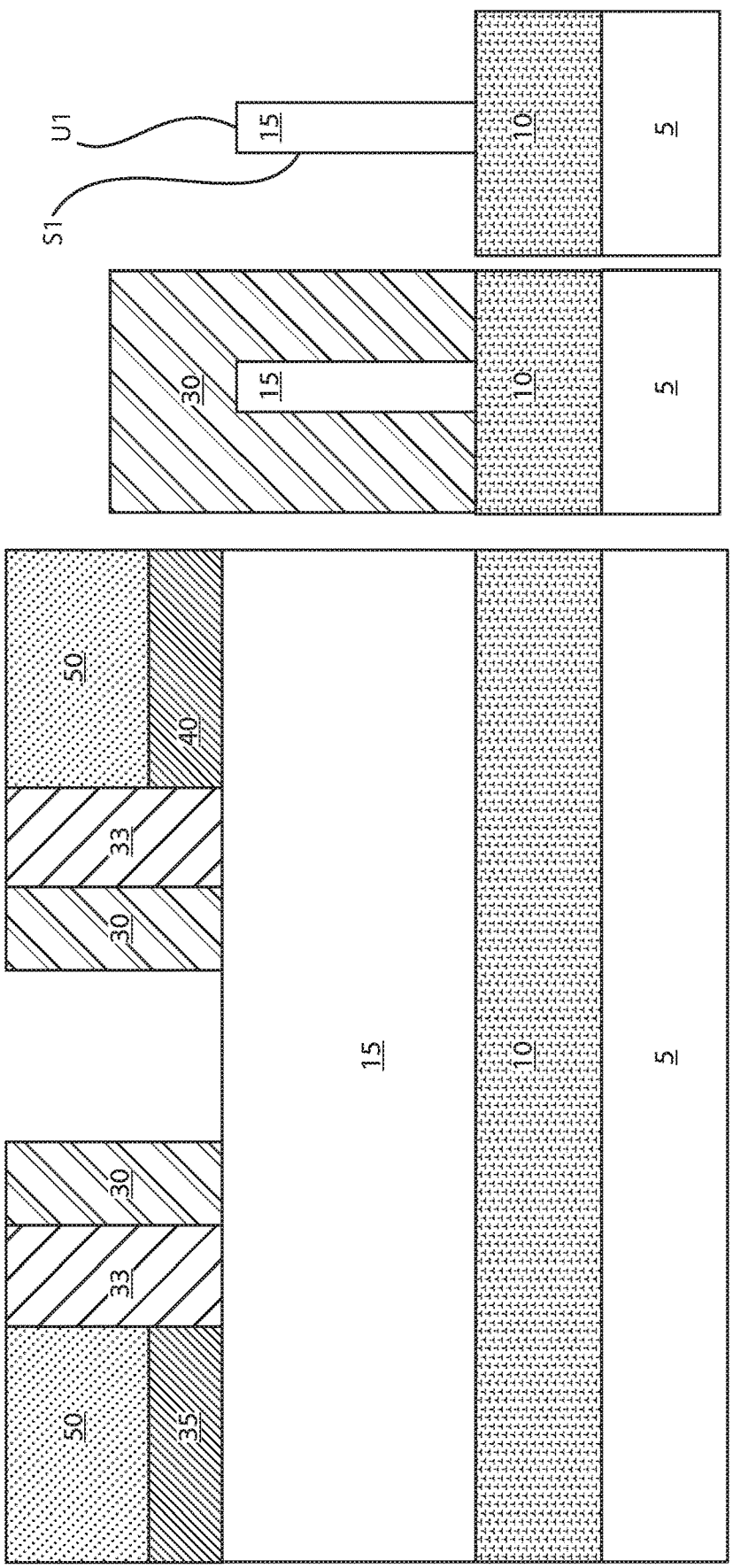

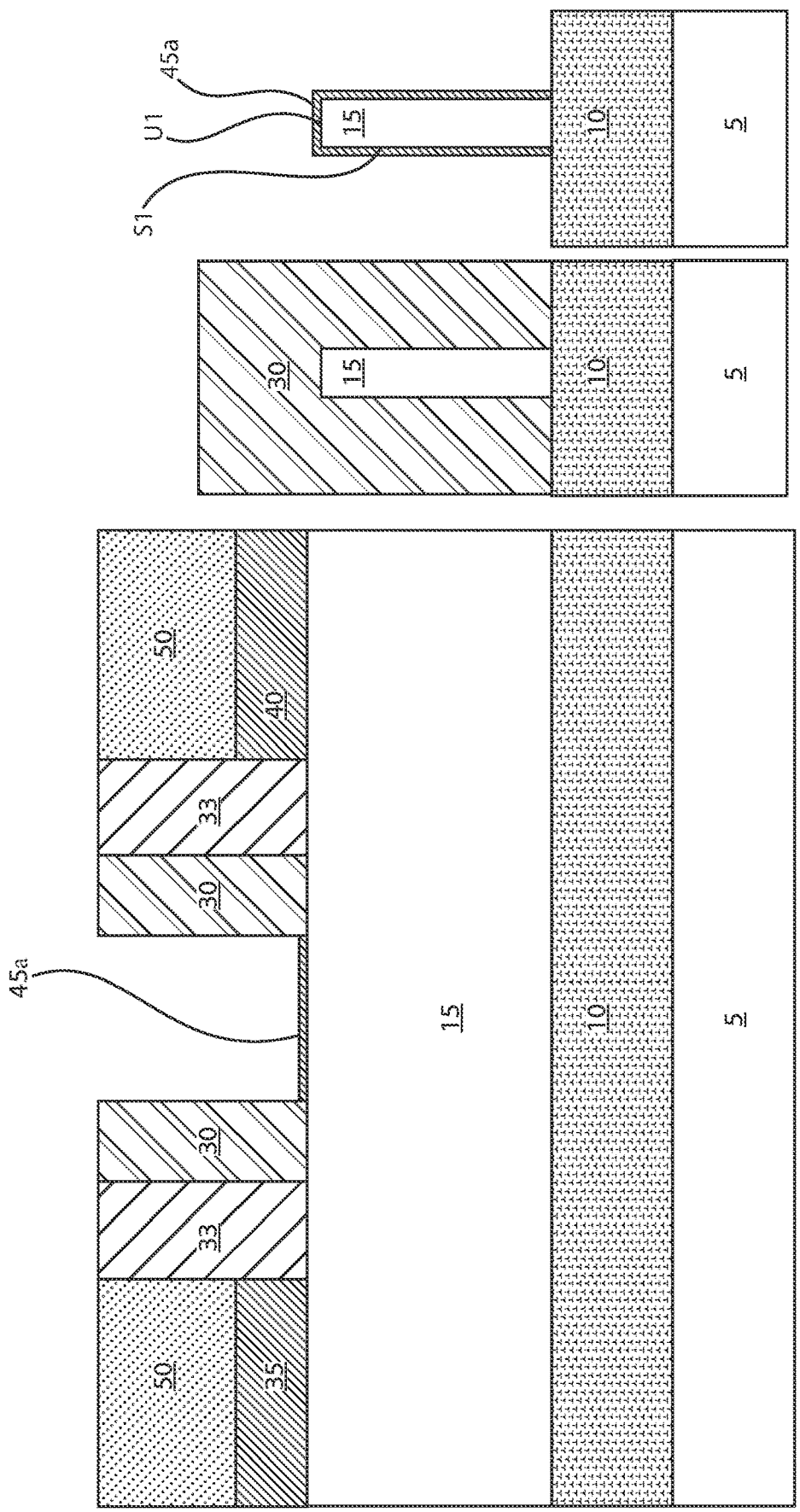

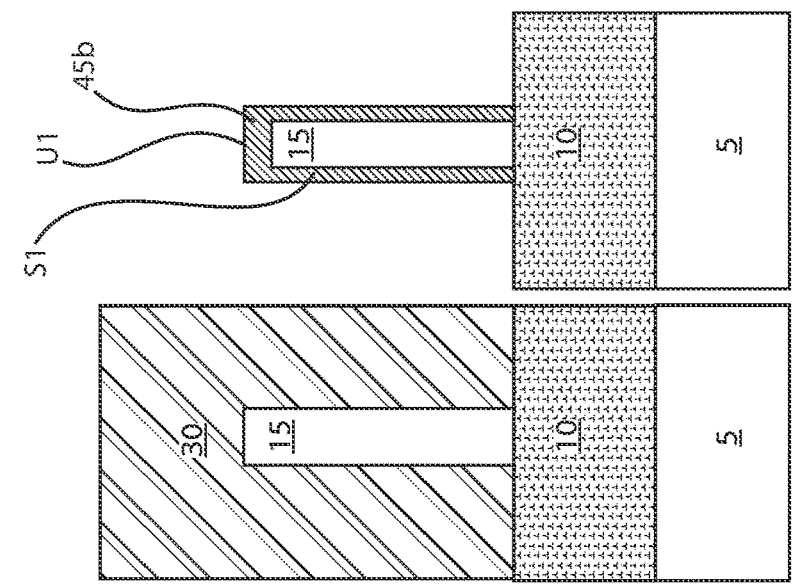
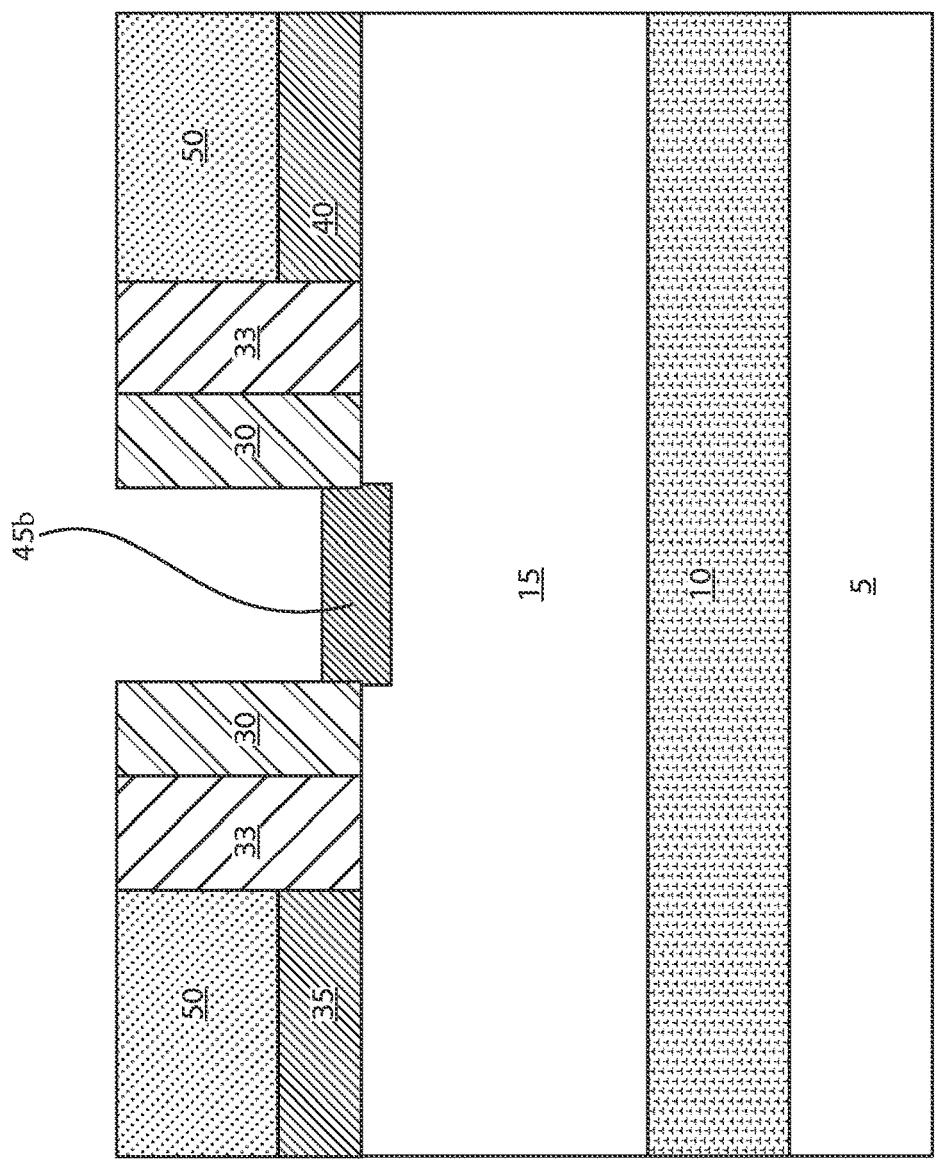
FIG. 8A  FIG. 8B  FIG. 8C

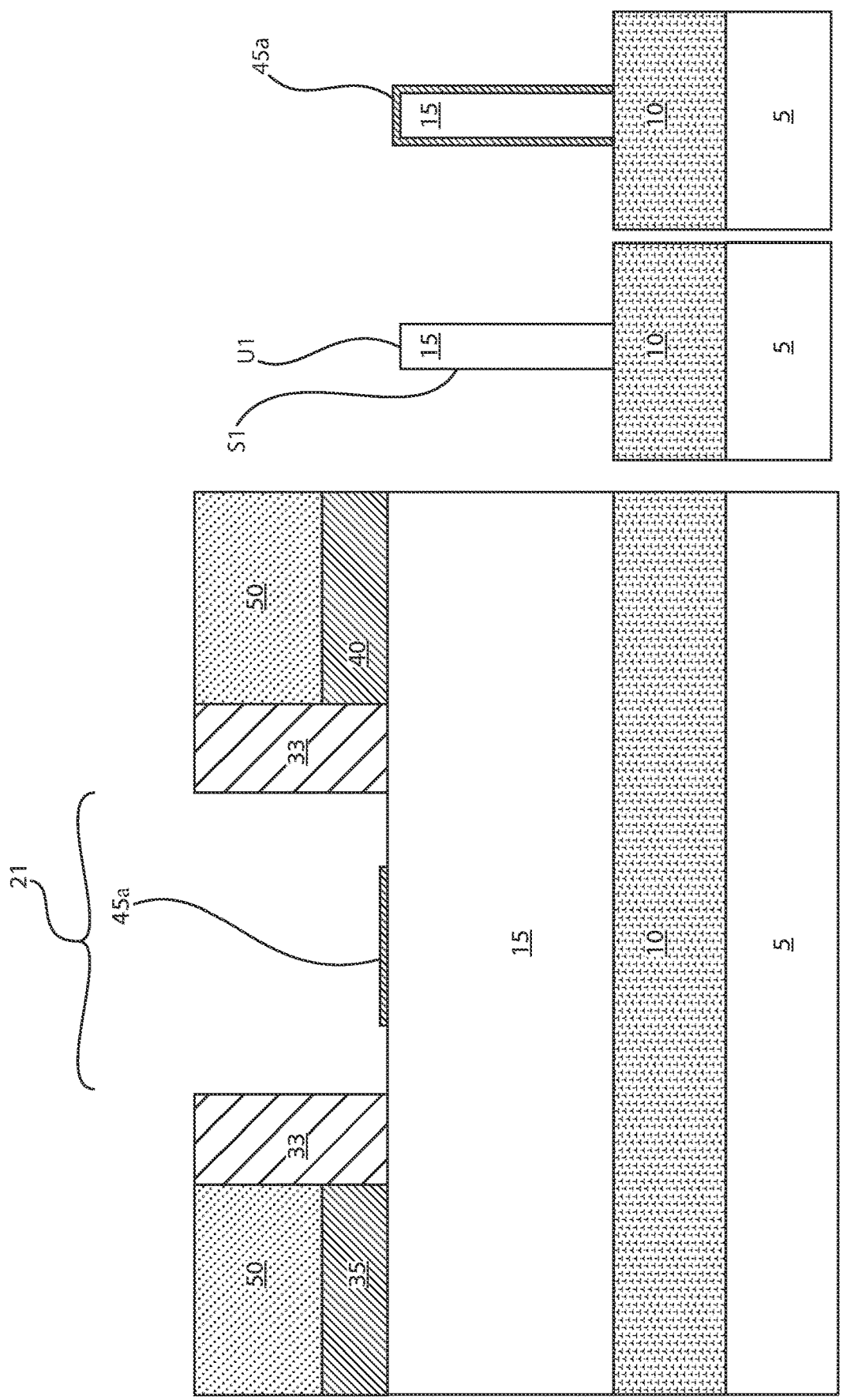

ASYMMETRIC CHANNEL FINFETS WITH WRAP AROUND CHANNEL

BACKGROUND

Technical Field

The present disclosure relates to semiconductor devices, such as semiconductor devices including fin structures.

Description of the Related Art

The dimensions of semiconductor field effect transistors (FETs) have been steadily shrinking over the last thirty years or so, as scaling to smaller dimensions leads to continuing device performance improvements. Planar FET devices typically have a conducting gate electrode positioned above a semiconducting channel, and electrically isolated from the channel by a thin layer of gate oxide. Current through the channel is controlled by applying voltage to the conducting gate. With conventional planar FET scaling reaching fundamental limits, the semiconductor industry is looking at more unconventional geometries that will facilitate continued device performance improvements. One such class of device is a fin field effect transistor (FinFET).

SUMMARY

In one aspect, a semiconductor device is provided that includes a channel epitaxial wrap around layer at each end of the channel that minimizes and/or eliminates the incidence of gate induced drain leakage (GIDL). In one embodiment, the semiconductor device includes a fin structure, and a channel epitaxial wrap around layer at each end of a channel portion of the fin structure. The semiconductor device also includes a gate structure including a gate dielectric having gate edge portions in direct contact with the channel epitaxial wrap around layer. A middle portion of the gate dielectric is in direct contact with a central channel portion of the fin structure. The central portion of the fin structure is between the two ends of the channel portion of the fin structure. Source and drain regions are present on opposing sides of the channel portion of the fin structure.

In another embodiment, the semiconductor device includes a pedestal of a first semiconductor material including a channel region between a source region and a drain region, and a channel wrap around layer of a second semiconductor material in direct contact with the pedestal of the first semiconductor material at each end of the channel region. In this embodiment, the semiconductor device may further include a gate structure including a gate dielectric having end portions in direct contact with the channel wrap around layer, wherein a middle portion of the gate dielectric is in direct contact with a central portion of the channel region. The central portion of the channel region is between each end of the channel portion of the pedestal of the first semiconductor material.

In another aspect, a method of forming a semiconductor device is provided that minimizes and/or eliminates the incidence of gate induced drain leakage (GIDL). In one embodiment, the method includes forming a semiconductor device that includes forming an inner dielectric spacer and outer dielectric spacer combination structure on a sacrificial gate structure that is present on a fin structure, wherein the inner dielectric spacer and outer dielectric spacer combination structure separates source and drain regions from the sacrificial gate structure. The method further includes removing the inner sidewall dielectric spacer; and forming a channel epitaxial wrap around layer on the portion of the fin structure that is exposed by removing the inner sidewall dielectric spacer. Thereafter, the sacrificial gate structure is removed to provide a gate opening to a channel portion of the fin structure, wherein the gate opening exposes the channel epitaxial wrap around layer; and a functional gate structure is formed within the gate opening.

BRIEF DESCRIPTION OF DRAWINGS

The following detailed description, given by way of example and not intended to limit the disclosure solely thereto, will best be appreciated in conjunction with the accompanying drawings, wherein like reference numerals denote like elements and parts, in which:

FIG. 2A is a side cross-sectional view along section line a-a of an initial structure used in accordance with one embodiment of the present disclosure, in which FIG. 2A depicts forming a fin structure.

FIG. 2B is a side cross-sectional view along second line b-b of FIG. 2A.

FIG. 6A is a side cross-sectional view of removing the inner dielectric spacer that is depicted in FIG. 5A to provide an opening to a channel region portion of the fin structure on opposing sides of the sacrificial gate structure, in accordance with one embodiment of the present disclosure.

FIG. 6B is a side cross-sectional view along section line b-b of FIG. 6A.

FIG. 6C is a side cross-sectional view along section line c-c of FIG. 6A.

FIG. 7A is a side cross-sectional view depicting forming a channel epitaxial wrap around layer on the surfaces of the channel portions of the fin structure that are exposed through the opening that is formed by removing the inner dielectric spacer, in accordance with one embodiment of the present disclosure.

FIG. 7B is a side cross-sectional view along section line b-b of FIG. 7A.

FIG. 7C is a side cross-sectional view along section line c-c of FIG. 7A.

FIG. 8A is a side cross-sectional view depicting forming a channel epitaxial wrap around layer on recessed surfaces of the channel portions of the fin structure that are etched into the fin structure through the opening that is formed by removing the inner dielectric spacer, in accordance with one embodiment of the present disclosure.

FIG. 8B is a side cross-sectional view along section line b-b of FIG. 8A.

FIG. 8C is a side cross-sectional view along section line c-c of FIG. 8A.

FIG. 9A is a side cross-sectional view depicting removing the sacrificial gate structure from the structure that is depicted in FIG. 8A, in accordance with one embodiment of the present disclosure.

FIG. 9B is a side cross-sectional view along section line b-b of FIG. 9A.

FIG. 9C is a side cross-sectional view along section line c-c of FIG. 9A.

DETAILED DESCRIPTION OF THE PREFERRED EMBODIMENTS

Figure 1:
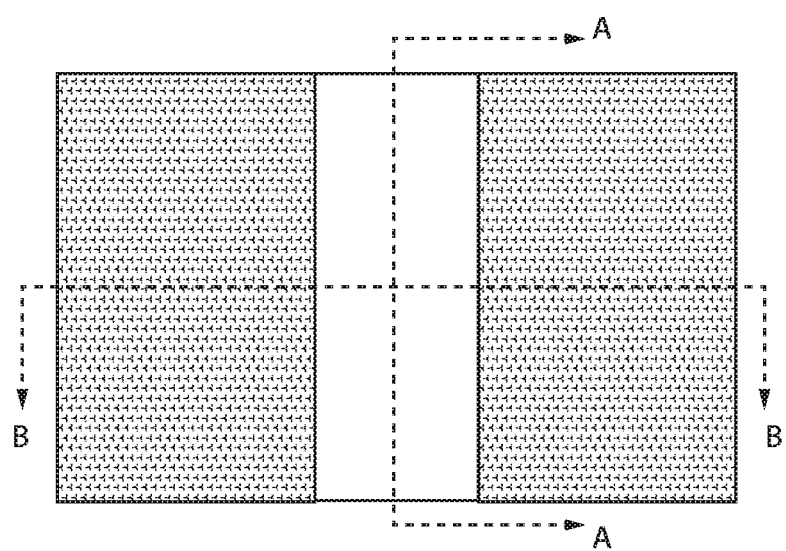
FIG. 1 is a top-down view depicting a fin structure for illustrating section lines a-a and b-b as used in the following figure descriptions.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

In some embodiments, the methods and structures disclosed herein form a FinFET semiconductor device that has increased resistance to gate induced drain leakage (GIDL).

A field effect transistor (FET) is a semiconductor device in which output current, i.e., source-drain current, is controlled by the voltage applied to a gate structure to the semiconductor device. A field effect transistor has three terminals, i.e., gate structure, source region and drain region. As used herein, a "fin structure" refers to a semiconductor material, which is employed as the body of a semiconductor device, in which the gate structure is positioned around the fin structure such that charge flows down the channel on the two sidewalls of the fin structure and optionally along the top surface of the fin structure. A FinFET is a semiconductor device that positions the channel region of the semiconductor device in a fin structure. The source and drain regions of the fin structure are the portions of the fin structure that are on opposing sides of the channel region of the fin structure.

The tunneling-based leakage currents caused when the gate overlaps the drain is referred to as the gate-induced drain leakage (GIDL). In some examples, under the application of strong vertical and longitudinal fields, the drain region in the overlap region may go into deep depletion as the vertical field tends to invert the region and the longitudinal field sweeps the inverted carriers (holes for n-channel devices). At high fields, the voltage drop across the deep depleted layer may cause trap assisted carrier generation resulting in leakage currents. In some examples, gate-induced drain leakage (GIDL) contributes to stand by power and excessive heat dissipation.

In some scenarios, the effect of gate-induced drain leakage (GIDL) is more visible at higher supply voltage (VDD) and lower gate voltage (Vg). In some instances, a thinner oxide thickness, i.e., thinner gate dielectric thickness, and higher VDD (higher potential between gate and drain) can enhance the electric field (proximate to the channel), and can therefore increase gate-induced drain leakage (GIDL).

The gate-induced drain leakage (GIDL) can worse with scaling down the electrical thickness at inversion state $T_{inv}$ value for CMOS technology. In some examples, a contributor to the incidence of gate-induced drain leakage (GIDL) can be band-to-band-tunneling, in which the gate-induced drain leakage (GIDL) can increase for higher mobility channels, e.g., channel regions composed of silicon germanium (SiGe), due to the narrower bandgap of these material types. Substrate engineering, such as increase of drain doping density, can help towards mitigating gate-induced drain leakage (GIDL). However, reducing gate-induced drain leakage (GIDL) by increasing drain doping density can be difficult to control for FinFET devices, because dopant diffusion from epitaxially grown source and drain regions to the fin is difficult to control.

In some embodiments, the methods and structures of the present disclosure can reduce the incidence of gate-induced drain leakage (GIDL) by employing a local epitaxy wrap around the channel structure in a FinFET configuration to reduce the oxide field near the source and the drain and thereby suppressing gate-induced drain leakage (GIDL). The methods and structures of the present disclosure are now discussed with more detail referring to FIGS. 1-10C.

Figure 2:
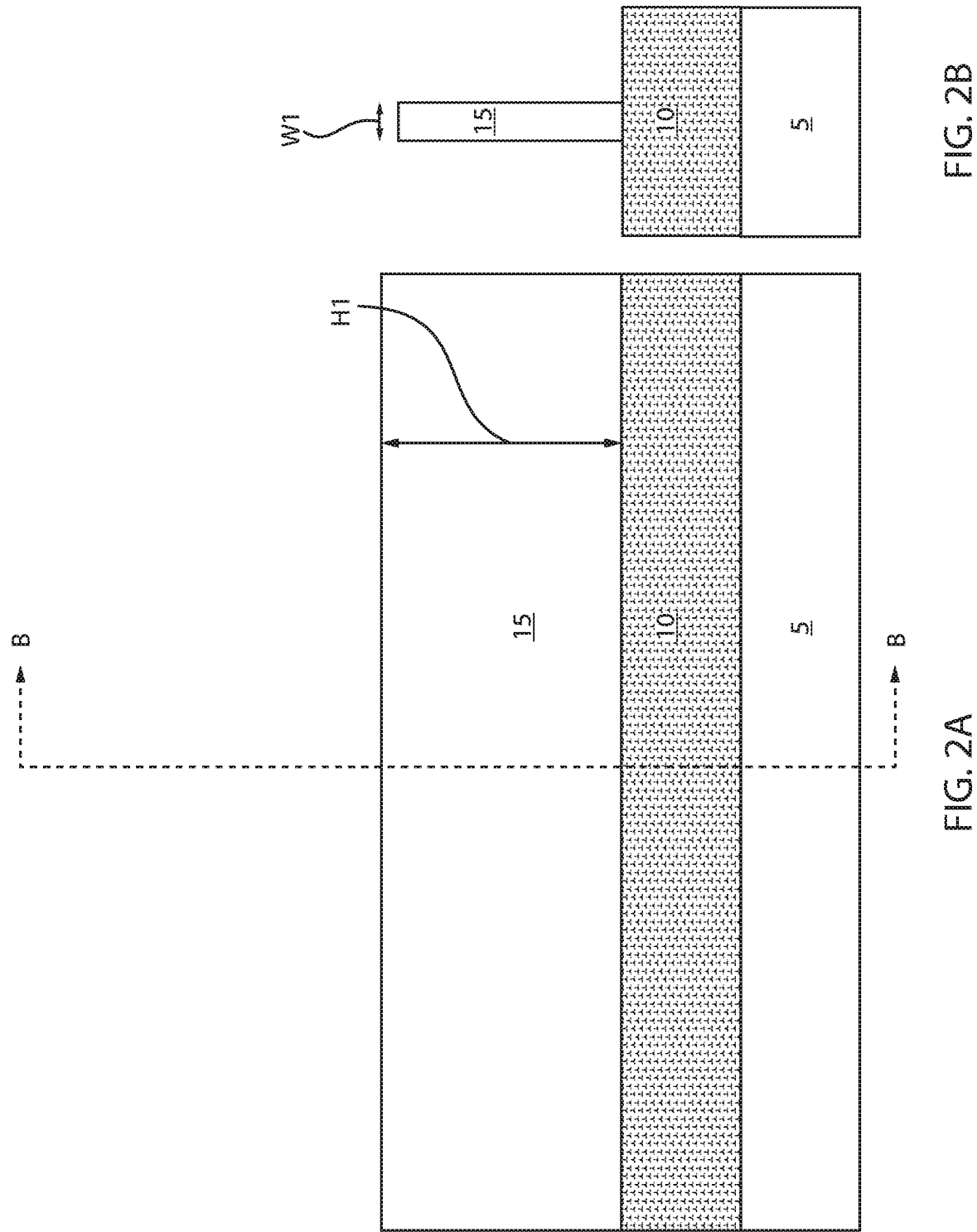

FIGS. 1-2B depict one embodiment of forming a fin structure 15 from a semiconductor substrate. Although FIGS. 1-2B illustrate a single fin structure 15, any plurality of fin structures 15 may be formed on the substrate. In FIG. 2A, the fin structure 15 is formed from the semiconductor, e.g., silicon (Si), on insulator (SOI) layer over a semiconductor, e.g., silicon (Si), on insulator (SOI) substrate, in which the buried insulating layer 10, e.g., buried oxide layer (BOX), of the SOI substrate is present underlying the fin structure 15, and a base supporting substrate 5 is present under the buried insulating layer 10. It is not necessary that the fin structure 15 be formed from the SOI layer of an SOI substrate. In some embodiments, the fin structure 15 may be formed from a bulk semiconductor substrate. In the embodiments, in which the fin structure 15 is formed on a bulk semiconductor substrate, bottom isolation via a punch through stopping (PTS) region may be employed.

The fin structure 15 may be formed from the semiconductor substrate using photolithography and etch processes. In one embodiment, the patterning process used to define each of the fin structures 15 is a sidewall image transfer (SIT) process. The SIT process can include forming a mandrel material layer (not shown) on the material layer that provides the fin structure 15, such as the SOI layer of an SOI substrate, or the bulk semiconductor substrate upper surface.

The mandrel material layer can include any material (semiconductor, dielectric or conductive) that can be selectively removed from the structure during a subsequently performed etching process. In one embodiment, the mandrel material layer may be composed of amorphous silicon or polysilicon. In another embodiment, the mandrel material layer may be composed of a metal, such as, e.g., aluminum (Al), tungsten (W), or copper (Cu). The mandrel material layer can be formed by a deposition method, such as chemical vapor deposition or plasma enhanced chemical vapor deposition. Following deposition of the mandrel material layer, the mandrel material layer can be patterned by lithography and etching to form a plurality of mandrel structures on the topmost surface of the semiconductor containing material that provides the fin structure 15, e.g., the SOI layer of an SOI substrate.

In some embodiments, the SIT process may continue by forming a dielectric spacer on each sidewall of each mandrel structure. The dielectric spacer can be formed by deposition of a dielectric spacer material, and then etching the deposited dielectric spacer material. The dielectric spacer material may comprise any dielectric spacer material such as, for example, silicon dioxide, silicon nitride or a dielectric metal oxide. Examples of deposition processes that can be used in providing the dielectric spacer material include, but are not limited to, chemical vapor deposition (CVD), plasma enhanced chemical vapor deposition (PECVD), or atomic layer deposition (ALD). Examples of etching that be used in providing the dielectric spacers include any etching process, such as, e.g., reactive ion etching (RIE). Since the dielectric spacers are used in the SIT process as an etch mask, the width of each dielectric spacer determines the width of each fin structure 15.

In some embodiments, after formation of the dielectric spacers, the SIT process continues by removing each mandrel structure. Each mandrel structure can be removed by an etching process that is selective for removing the mandrel material as compared to silicon. Following the mandrel structure removal, the SIT process continues by transferring the pattern provided by the dielectric spacers into the semiconductor material layer that provides the fin structure 15, such as the SOI layer of an SOI substrate. The pattern transfer may be achieved by utilizing at least one etching process that can include dry etching, such as reactive ion etching (RIE), plasma etching, ion beam etching or laser ablation, chemical wet etch processes or a combination thereof. In one example, the etch process used to transfer the pattern may include one or more reactive ion etching (RIE) steps. The etching steps pattern the semiconductor material layer to provide the fin structure 15. Following etching, i.e., pattern transfer, the SIT process may conclude with removing the dielectric spacers using an etch process or a planarization process.

It is noted that the aforementioned spacer image transfer (SIT) process is only one method of forming a fin structure 15. In another embodiment, the fin structures 15 may be formed using a photoresist etch mask. Specifically, in one example, a photoresist mask is formed overlying the semiconductor composition layer which provides the fin structure 5. The exposed portions of the semiconductor layer that provides the fin structure 5 that are not protected by the photoresist mask are removed using a selective etch process. To provide the photoresist mask, a photoresist layer is first positioned on the semiconductor layer that provides the fin structure 5, e.g., SOI layer of an SOI substrate or upper surface of bulk semiconductor substrate. The photoresist layer may be provided by a blanket layer of photoresist material that is formed utilizing a deposition process such as, e.g., plasma enhanced CVD (PECVD), evaporation or spin-on coating.

The blanket layer of photoresist material is then patterned to provide the photoresist mask utilizing a lithographic process that may include exposing the photoresist material to a pattern of radiation and developing the exposed photoresist material utilizing a resist developer. Following the formation of the photoresist mask, an etching process may remove the unprotected portions of the semiconductor layer that provides the fin structure 5. The etch process may be an anisotropic process, such as reactive ion etch (RIE).

Referring to FIGS. 2A and 2B, the fin structure 15 may have a height Hi ranging from 5 nm to 200 nm. In another embodiment, the fin structure 15 may have a height Hi ranging from 10 nm to 100 nm. In one example, the fin structure 15 may have a height Hi ranging from 20 nm to 50 nm. The fin structure 15 may have a width Wi of less than 20 nm. In another embodiment, the fin structures 5 have a width Wi ranging from 6 nm to 8 nm. In embodiments including a plurality of fin structures 15, the pitch separating adjacent fin structures 15 may range from 10 nm to 500 nm. In another example, the pitch separating adjacent fin structures in the plurality of fin structures 15 may range from 20 nm to 50 nm. It is not necessary that the fin structure 15 have the aforementioned dimensions. Further, the fin structure may simply be a pedestal of semiconductor material that is supported by a base substrate.

In some embodiments, the fin structure 15 may be composed of a silicon including material that provides the semiconductor substrate 1, which may include, but is not limited to, silicon, single crystal silicon, multicrystalline silicon, polycrystalline silicon, amorphous silicon, strained silicon, silicon doped with carbon (Si:C), silicon alloys or any combination thereof. The fin structure 15 may also be composed of germanium including semiconductor materials, such as silicon germanium (SiGe) or germanium (Ge). The fin structure 15 may also be composed of a type III-V semiconductor material, such as Indium gallium arsenide (InGaAs).

Figure 3:
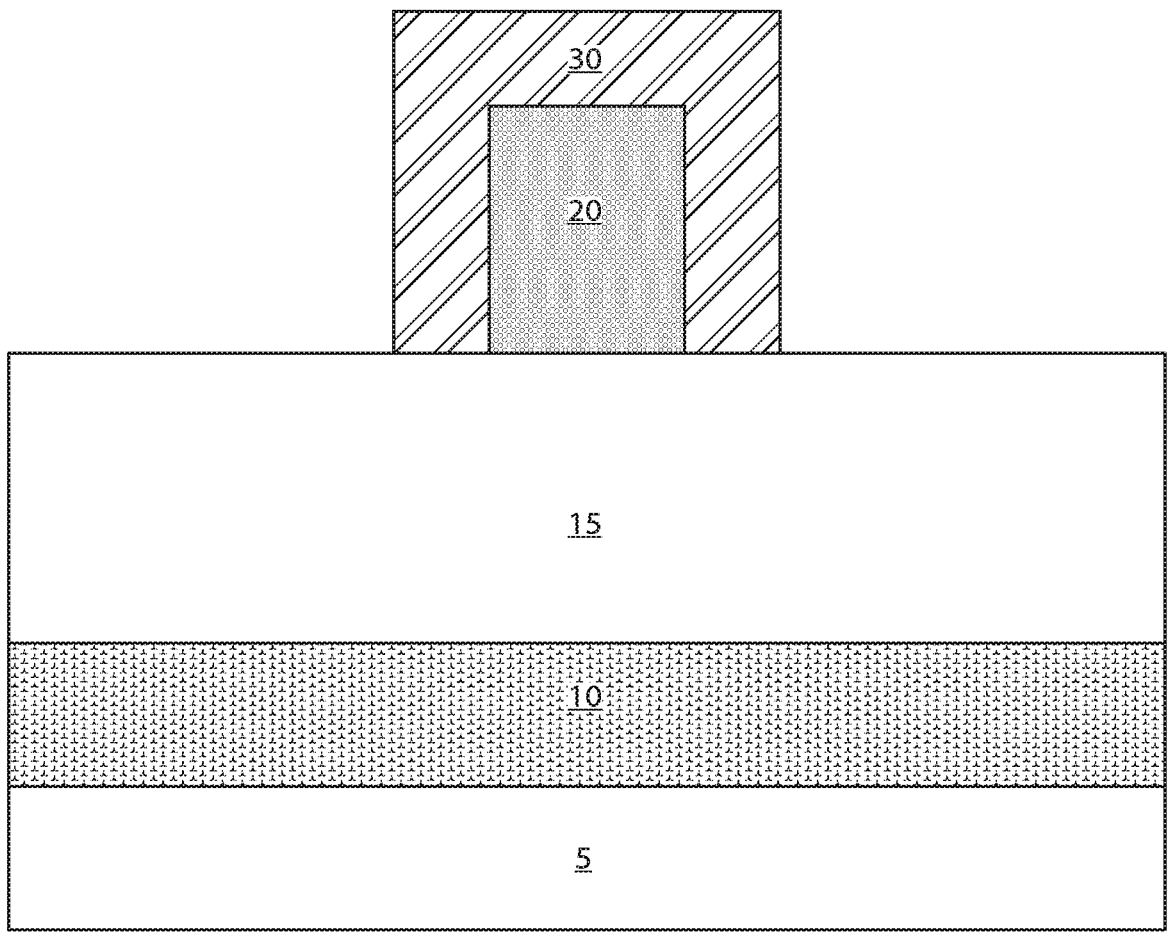
FIG. 3 is a side cross-sectional view depicting forming a sacrificial gate structure on the structure depicted in FIG. 2A and forming an inner dielectric spacer on the sacrificial gate structure.

FIG. 3 depicts forming a sacrificial gate structure 25 on the structure depicted in FIG. 2A, and forming an inner spacer 30 on the sacrificial gate structure 25. In one embodiment, the sacrificial gate structure 25 may be formed contacting the channel region of the fin structure 15. The term "sacrificial" as used to describe the replacement gate conductor denotes that the structure is present during the process sequence, but is not present in the final device structure, in which the replacement structure provides an opening that dictates the size and geometry of a later formed functional gate conductor.

The sacrificial material that provides the sacrificial gate electrode of the sacrificial gate structure 25 may be composed of any material that can be etched selectively to the underlying fin structures 15. In one embodiment, the sacrificial material that provides the sacrificial gate electrode may be composed of a silicon-containing material, such as polysilicon. Although, the sacrificial gate electrode is typically composed of a semiconductor material, the sacrificial gate electrode may also be composed of a dielectric material, such as an oxide, nitride or oxynitride material, or amorphous carbon.

The sacrificial material may be patterned and etched to provide the sacrificial gate electrode. Specifically, and in one example, a pattern is produced by applying a photoresist to the surface to be etched, exposing the photoresist to a pattern of radiation, and then developing the pattern into the photoresist utilizing a resist developer. Once the patterning of the photoresist is completed, the sections if the sacrificial material covered by the photoresist are protected to provide the sacrificial gate electrode, while the exposed regions are removed using a selective etching process that removes the unprotected regions. Following formation of sacrificial gate electrode, the photoresist may be removed.

At least one dielectric inner spacer 30 may then be formed on the sidewall and the upper surface of the gate electrode of the sacrificial gate structure 25. In one embodiment, the dielectric inner spacer 30 may be formed by using a blanket layer deposition, such as CVD, and an anisotropic etch. The dielectric inner spacer 30 may have a conformal thickness. The dielectric inner spacer 30 may have a thickness ranging from 2.0 nm to 10.0 nm, preferred 6-8 nm, and may be composed of a dielectric, such as a nitride, oxide, oxynitride, or a combination thereof. The dielectric inner spacer 30 may also be referred to as an inner gate spacer. In one embodiment, the dielectric inner spacer 30 may be composed of silicon nitride, and the thickness of the dielectric inner spacer 30 as measured from the sidewall of the sacrificial gate structure is equal to a value ranging from 3 nm to 6 nm. It is noted that this example for the composition and thickness of the dielectric inner spacer 30 only represents one example of the present disclosure. Any material may be suitable for the dielectric inner spacer 30 (also referred to as inner gate spacer) so long as the composition selected allows for its removal selectively to the later formed dielectric outer spacer 33 (also referred to as outer gate spacer).

Figure 4:
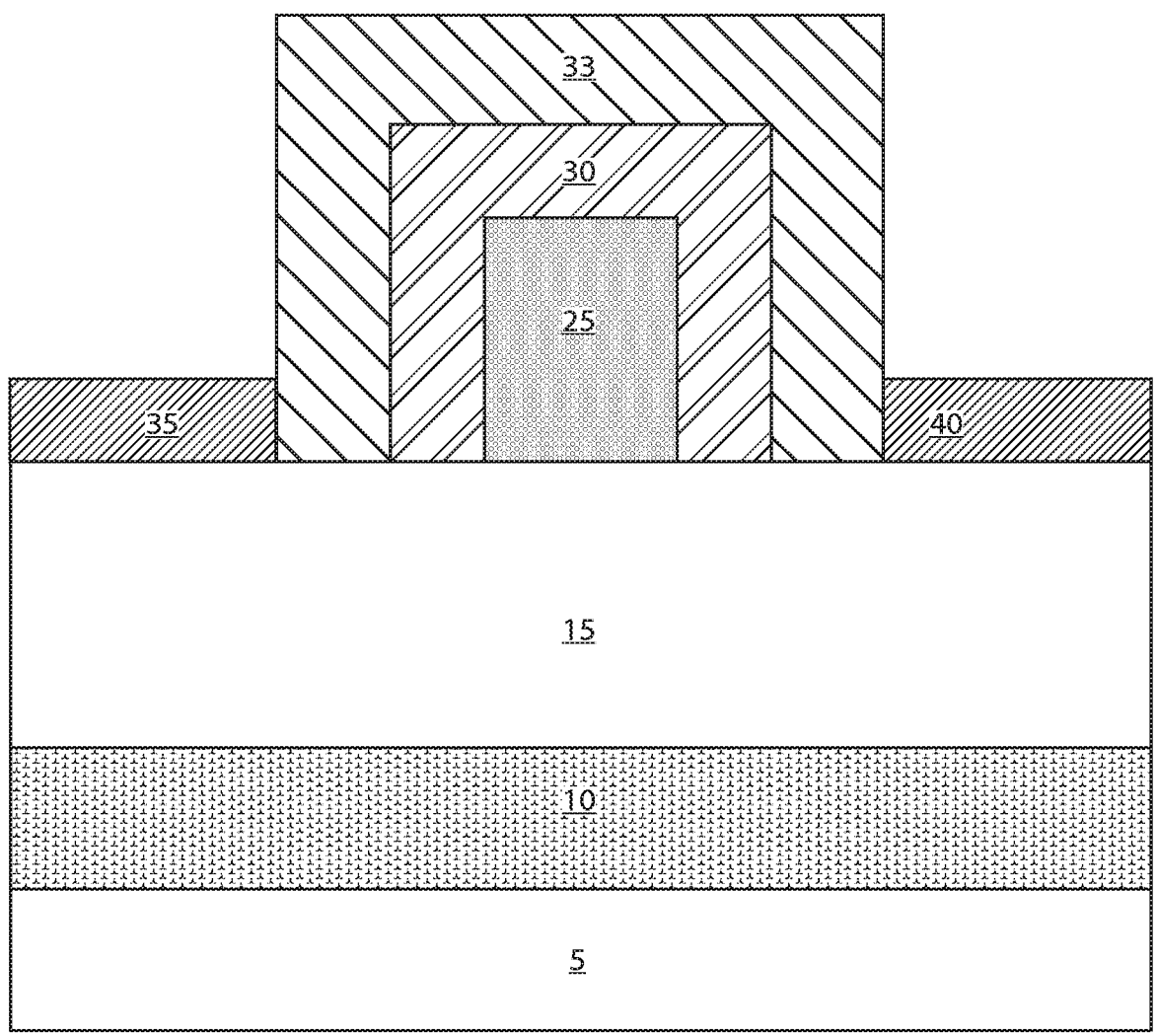
FIG. 4 is a side cross-sectional view depicting forming an outer dielectric spacer on the inner dielectric spacer that is depicted in FIG. 3 and forming epitaxial source and drain regions on the source and drain region portions of the fin structures depicted in FIG. 3.

FIG. 4 depicts forming an outer dielectric spacer 33 (also referred to as outer gate spacer) on the inner dielectric spacer 30 and forming epitaxial source and drain regions on the source and drain region portions 35, 40 of the fin structures depicted in FIG. 3. The outer dielectric spacer 33 is similar to the inner dielectric spacer 30 that has been described above with reference to FIG. 3. For example, the inner dielectric spacer 30 is typically formed using a conformal deposition process to provide a layer having a conformal thickness. In one embodiment, the outer dielectric spacer 33 may be formed by using a blanket layer deposition, such as CVD, and an anisotropic etch. The outer dielectric spacer 33 may have a thickness ranging from 2.0 nm to 15.0 nm, and may be composed of a dielectric, such as a nitride, oxide, oxynitride, or a combination thereof. The outer dielectric spacer 33 may also be referred to as an outer gate spacer. In one embodiment, the outer dielectric spacer 33 may be composed of silicon oxide, and the thickness of the outer dielectric spacer 33 as measured from the sidewall of the inner dielectric spacer 30 is value ranging from 4 nm to 8 nm.

Following the formation of the outer dielectric spacer 33, the epitaxial source and drain region portions 35, 40 are formed on the source and drain region portions of the fin structure 15 that are present on opposing sides of the gate structure 25, as well as being on opposing sides of the channel region portion of the fin structure 15. The epitaxial source and drain region portions 35, 40 are doped to the conductivity type of the device. For example, if the FinFET is an n-type FinFET, the epitaxial source and drain region portions 35, 40 are doped to an n-type conductivity; and if the FinFET is a p-type FinFET, the epitaxial source and drain region portions 35, 40 are doped to a p-type conductivity.

In some embodiments, the epitaxial source and drain region portions 35, 40 may be composed of silicon, a silicon carbon alloy (e.g., silicon doped with carbon (Si:C), silicon germanium, a silicon germanium and carbon alloy (e.g., silicon germanium doped with carbon (SiGe:C), silicon alloys, germanium, germanium alloys, gallium arsenide, indium arsenide, indium phosphide, as well as other III/V and II/VI compound semiconductors. The epitaxial source and drain region portions 35, 40 is grown using an epitaxial growth or deposition process. "Epitaxial growth and/or deposition" means the growth of a semiconductor material on a deposition surface of a semiconductor material, e.g., the exposed surface of the fin structures 15 having the first orientation, in which the semiconductor material being grown has substantially the same crystalline characteristics as the semiconductor material of the deposition surface. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, an epitaxial film deposited on a {100} crystal surface will take on a {100} orientation.

A number of different sources may be used for the epitaxial deposition of the epitaxial source and drain region portions 35, 40. For example, a silicon including first epitaxial semiconductor material may be deposited from a silicon including source gas that is selected from the group consisting of silane, disilane, trisilane, tetrasilane, hexachlorodisilane, tetrachlorosilane, dichlorosilane, trichlorosilane, and combinations thereof. Examples of germanium including source gasses for epitaxially forming the first epitaxial semiconductor material includes germane, digermane, halogermane, dichlorogermane, trichlorogermane, tetrachlorogermane and combinations thereof. The temperature for epitaxial deposition typically ranges from 450° C. to 900° C. Although higher temperature typically results in faster deposition, the faster deposition may result in crystal defects and film cracking.

Figure 5:
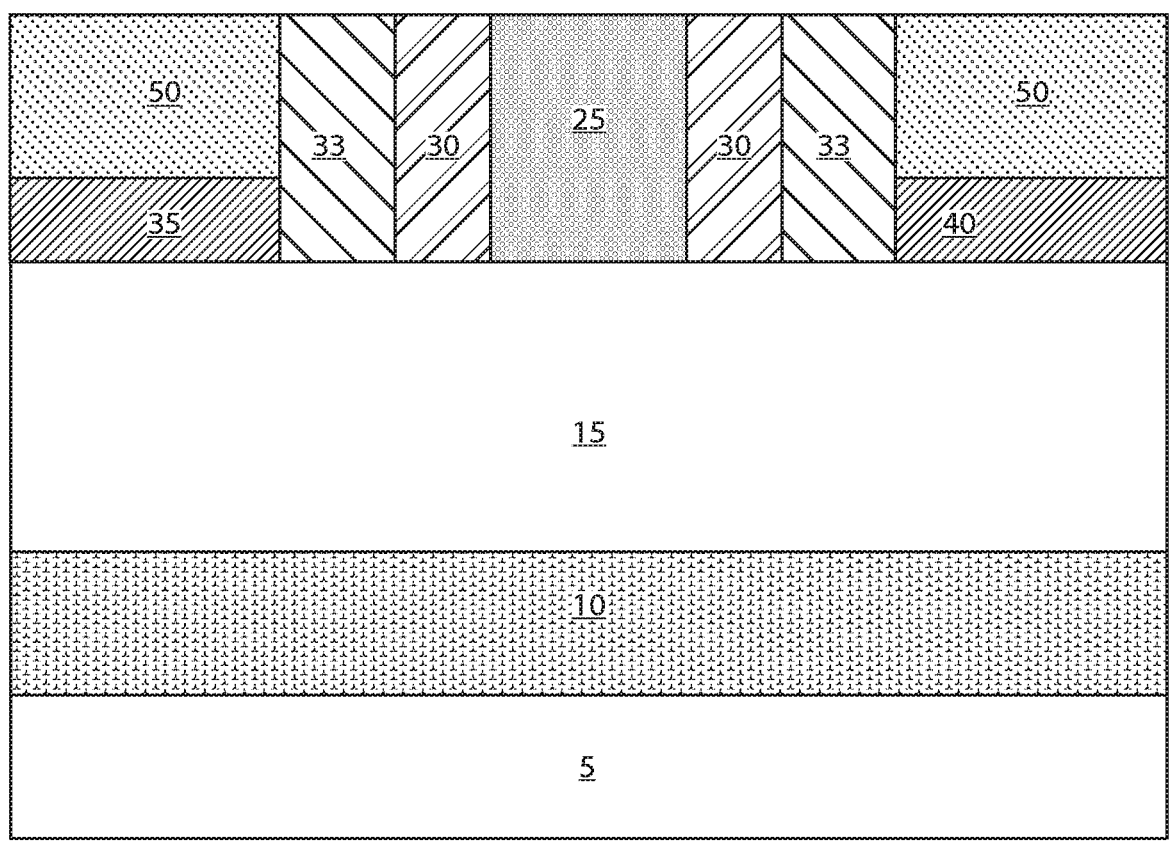
FIG. 5 is a side cross-sectional view depicting forming an interlevel dielectric layer having an upper surface that is coplanar with the upper surface of the sacrificial gate structure.

The dopant for the epitaxial source and drain region portions 35, 40 may be introduced to the semiconductor material by an in situ doping process. The term "in situ" denotes that the dopant, e.g., n-type or p-type dopant, is introduced to the base semiconductor material, e.g., silicon or silicon germanium, during the formation of the base material. For example, an in situ doped epitaxial semiconductor material may introduce n-type or p-type dopants to the material being formed during the epitaxial deposition process that includes n-type or p-type source gasses. In one embodiment, the n-type gas dopant source may include arsine ($AsH_3$), phosphine ($PH_3$) and alkylphosphines, such as with the empirical formula $R_xPH_{(3-x)}$, where R=methyl, ethyl, propyl or butyl and x=1, 2 or 3. Alkylphosphines include trimethylphosphine (($CH_3$)$_3$P), dimethylphosphine (($CH_3$)$_2$PH), triethylphosphine (($CH_3CH_2$)$_3$P) and diethylphosphine (($CH_3CH_2$)$_2$PH). The p-type gas dopant source may include diborane ($B_2H_6$). The dopant for the epitaxial source and drain region portions 35, 40 that dictates the conductivity type of the epitaxial source and drain region portions 35, 40 is typically present in a concentration ranging from $4\times10^{20}$ atoms/cm$^3$ to $2.5\times10^{21}$ atoms/cm$^3$, if the source drain epitaxy is a group IV semiconductor or alloy, like Si or SiGe FIG. 5 illustrate one embodiment depicting forming an intralevel dielectric layer 50 having an upper surface that is coplanar with the upper surface of the sacrificial gate structure 25. The intralevel dielectric layer 50 may be selected from the group consisting of silicon containing materials such as $SiO_2$, $Si_3N_4$, $SiO_xN_y$, SiC, SiCO, SiCOH, and SiCH compounds, the above-mentioned silicon containing materials with some or all of the Si replaced by Ge, carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC), also known as amorphous hydrogenated carbon, α-C:H). The interlevel dielectric layer 50 may be deposited by chemical vapor deposition (CVD), physical vapor deposition (PVD), spin on deposition, deposition from solution or a combination thereof. Following deposition, the upper surface of the intralevel dielectric layer 50 may be planarized until coplanar with the upper surface of the sacrificial electrode 20. This step of the process sequence may also remove the upper portion of the inner dielectric spacer 30 and the outer dielectric spacer 33 to expose the upper surface of the sacrificial electrode 20. The planarization process may be provided by chemical mechanical planarization.

FIGS. 6A-6C depict one embodiment of removing the inner dielectric spacer 30. Removing the inner dielectric spacer 30 exposes a portion of the fin structure in the channel region of the device, in which a channel epitaxial wrap around layer 45a, 45b is subsequently formed that mitigates, reduces and/or eliminates gate induced drain leakage (GIDL).

In one embodiment, the inner dielectric spacer 30 may be selectively removed without removing at least one of the sacrificial gate structure 25, the outer dielectric spacer 33, the interlevel dielectric layer 50, and the fin structure 15. As used herein, the term "selective" in reference to a material removal process denotes that the rate of material removal for a first material, e.g., inner dielectric spacer 30, is greater than the rate of removal for at least another material, e.g., intralevel dielectric 50, outer dielectric spacer 33 and/or fin structure 15, of the structure to which the material removal process is being applied. For example, in one embodiment, a selective etch may include an etch chemistry that removes a first material selectively to a second material by a ratio of 10:1 or greater. In some embodiments, the inner dielectric spacer 30 may be removed by an anisotropic etch, such as reactive ion etching, or a wet etch.

Referring to FIG. 6C, in some embodiments, by removing the inner dielectric spacer 30 both sidewalls S1, S2 and upper surfaces U1 of the fin structure 15 in the channel region of the fin structures are exposed. These surfaces S1, S2, U1 provide the deposition location for the channel epitaxial wrap around layer 45a, 45b.

FIGS. 7A-8C depict some embodiments of forming the channel epitaxial wrap around layer 45a, 45b on the portions of the channel for the fin structure 15 that is exposed by removing the inner dielectric spacer 30. Gate induced drain leakage (GIDL) is caused by band to band tunneling current that can be suppressed by lowering electric field especially near drain region. One way to lower the electric field is by introducing dual threshold voltage (Vt) along the channel direction near source/drain region. In the methods and structures described herein, epitaxial semiconductor materials in the form of the channel epitaxial wrap around layer 45a, 45b proximate to the source/drain region having a lower threshold voltage (Vt) than the nominal device region lower the aforementioned electric field, and suppress band to band tunneling current, which in turn results in a reduction of the gate induced drain leakage. For example, in an n-type device having a channel region within a silicon (Si) fin structure, channel epitaxial wrap around layers 45a, 45b composed of silicon doped with carbon (Si:C) that are positioned proximate to the source/drain region having a lower threshold voltage (Vt) than the nominal device region, and therefore can reduce gate induced drain leakage in n-type semiconductor devices, such as n-type FinFETs. In another example, in a p-type device having a channel region within a silicon (Si) fin structure, channel epitaxial wrap around layers 45a, 45b composed of silicon germanium (SiGe) that are positioned proximate to the source/drain region having a lower threshold voltage (Vt) than the nominal device region, and therefore can reduce gate induced drain leakage in p-type semiconductor devices, such as p-type FinFETs.

FIGS. 7A-7C depict one embodiment, in which the channel epitaxial wrap around layer 45a is formed directly on the surface of the channel portion of the fin structure 15 without recessing the surface of the fin structure 15 using an etch process. In this example, the channel epitaxial wrap around layer 45a is formed on the topical surface of the channel portion of the fin structure 15 that is exposed by removing the inner dielectric spacer 30 without significantly etching (or not etching) the fin structure 15. The channel epitaxial wrap around layer 45a that is formed on the exposed surfaces S1, S2, U1 of the fin structure 15 may have a thickness as great as 5 nm. In some embodiments, the thickness of the channel epitaxial wrap around layer 45a may range from 1 nm to 2 nm. The channel epitaxial wrap around layer 45a is a conformally deposited material layer that is continuous and extends along an entirety of the height of a first sidewall S1, is present along an entirety of the fin structures upper surface U1, and extends along an entirety of the height of the second sidewall S2.

The composition of the channel epitaxial wrap around layer 45a is selected to match the conductivity type (whether the semiconductor device is an n-type or p-type device, e.g., n-type FinFET or p-type FinFET) of the ultimately formed semiconductor device. For example, when the semiconductor device is an n-type semiconductor device, such as an n-type FinFET, and the fin structure is composed of silicon (Si), the channel epitaxial wrap around layer 45a may be composed of silicon doped with carbon (Si:C). For example, when the semiconductor device is a p-type semiconductor device, such as a p-type FinFET, and the fin structure is composed of silicon (Si), the channel epitaxial wrap around layer 45a may be composed of silicon germanium (SiGe).

The channel epitaxial wrap around layer 45a is composed of an epitaxial material. The term "epitaxial material" denotes a material that is formed using epitaxial growth. A number of different sources may be used for the deposition of epitaxial silicon germanium. In some embodiments, the gas source for the deposition of epitaxial SiGe may include a mixture of silicon containing gas sources and germanium containing gas sources. For example, an epitaxial layer of silicon germanium may be deposited from the combination of a silicon gas source that is selected from the group consisting of silane, disilane, trisilane, tetrasilane, hexachlorodisilane, tetrachlorosilane, dichlorosilane, trichlorosilane, and combinations thereof, and a germanium gas source that is selected from the group consisting of germane, digermane, halogermane, dichlorogermane, trichlorogermane, tetrachlorogermane and combinations thereof. The germanium content of the epitaxial layer of silicon germanium for the channel epitaxial wrap around layer 45a may range from 5% to 70%, by atomic weight %. In another embodiment, the germanium content of the epitaxial layer of silicon germanium may range from 10% to 40%.

A number of different sources may be used for the deposition of epitaxial silicon doped with carbon (Si:C). Silicon sources, i.e., silane containing gas precursor, useful in the deposition gas to deposit silicon containing compounds for the formation of silicon doped with carbon include silanes, halogenated silanes and organosilanes. Silane containing gas precursors include silane ($SiH_4$) and higher silanes with the empirical formula $Si_xH_{(2x+2)}$, such as disilane ($Si_2H_6$), trisilane ($Si_3H_8$), and tetrasilane ($Si_4H_{10}$), as well as others. Halogenated silanes include compounds with the empirical formula $X'_ySi_xH_{(2x+2-y)}$, where X'=F, Cl, Br or I, such as hexachlorodisilane ($Si_2Cl_6$), tetrachlorosilane ($SiCl_4$), dichlorosilane ($Cl_2SiH_2$) and trichlorosilane ($Cl_3SiH$). Organosilanes include compounds with the empirical formula $R_ySi_xH_{(2x+2-y)}$, where R=methyl, ethyl, propyl or butyl, such as methylsilane (($CH_3$)$SiH_3$), dimethylsilane (($CH_3$)$_2SiH_2$), ethylsilane (($CH_3CH_2$)$SiH_3$), methyldisilane (($CH_3$)$Si_2H_5$), dimethyldisilane (($CH_3$)$_2Si_2H_4$) and hexamethyldisilane (($CH_3$)$_6Si_2$).

Carbon sources, i.e., carbon containing precursors, that are useful to deposit silicon containing compounds, such as silicon doped with carbon (Si:C) include organosilanes, alkyls, alkenes and alkynes of ethyl, propyl and butyl. Such carbon sources include methylsilane ($CH_3SiH_3$), dimethylsilane (($CH_3$)$_2SiH_2$), ethylsilane ($CH_3CH_2SiH_3$), methane ($CH_4$), ethylene ($C_2H_4$), ethyne ($C_2H_2$), propane ($C_3H_8$), propene ($C_3H_6$), butyne ($C_4H_6$), as well as others. The carbon concentration of an epitaxial layer is in the range from 0.5% to 3%. In another embodiment, the carbon concentration ranges from 1% to 2%. In one example, the carbon concentration is 1.5%. In one embodiment, the carbon concentration may be graded within the epitaxially formed semiconductor layer.

In the embodiment that is depicted in FIGS. 7A-7C, the channel epitaxial wrap around layer 45a having a thickness ranging from 1 nm to 2 nm on the outer surface of the fin structure 15 slightly increases the fin size towards the source-drain region. The increase in the fin size, as well as changing material composition from the fin composition to the deposited composition of the channel epitaxial wrap around layer 45a can both lead to threshold voltage $V_t$ variation. This is one reason by the methods and structures described herein can reduce gate induced drain leakage.

FIGS. 8A-8C depict another embodiment of the present disclosure, in which after removing the inside dielectric spacer 30, and the prior to depositing the epitaxial material for the channel epitaxial wrap around layer 45b, the exposed surfaces of the fin structure 15 are recessed. For example, a recess having a deposition of less than 5 nm may be formed by etching the exposed portions of the fin structure 15 through the opening that is formed by removing the inner dielectric spacer 30. This etch process may remove the material of the fin structure 15 selectively to the outer dielectric spacer 33, the sacrificial gate structure 25 and the interlevel dielectric layer 50. The etch process may be a wet etch, such as wet chemical etching, or a dry etch, such as plasma etching. The etch process may be an isotropic etch. In some embodiments, the etch process forms a recess in the exposed portion of the fin structure 15 having a depth ranging from 1 nm to 2 nm. The recess may be a continuous channel that is formed along an entirety of the height of a first sidewall S1, is present along an entirety of the fin structures upper surface U1, and extends along an entirety of the height of the second sidewall S2.

Still referring to FIGS. 8A-8C, following the formation of the recesses on the exposed portions of the fin structure 15, the recesses can be filled with an epitaxially formed material to provide the channel epitaxial wrap around layer 45b. The channel epitaxial wrap around layer 45b that is depicted in FIGS. 8A-8C is similar to the channel epitaxial wrap around layer 45a that is depicted in FIGS. 7A-7C. For example, similar to the channel epitaxial wrap around layer 45a depicted in FIGS. 7A-7C, the composition for the channel epitaxial wrap around layer 45b depicted in FIGS. 8A-8C may have a composition selected to correspond to the conductivity type of the semiconductor device being formed. For example, when the semiconductor device is an n-type semiconductor device, such as an n-type FinFET, and the fin structure is composed of silicon (Si), the channel epitaxial wrap around layer 45b may be composed of silicon doped with carbon (Si:C). For example, when the semiconductor device is a p-type semiconductor device, such as a p-type FinFET, and the fin structure is composed of silicon (Si), the channel epitaxial wrap around layer 45b may be composed of silicon germanium (SiGe). The epitaxial gas source precursors that have been described above for the forming channel epitaxial wrap around layer 45a that is depicted in FIGS. 7A-7C are equally suitable for forming the channel epitaxial wrap around layer 45b that is depicted in FIGS. 8A-8C.

The thickness of the epitaxially formed material that is deposited within the recess for the channel epitaxial wrap around layer 45b can be selected to fill the recess. In some embodiments, the thickness of the epitaxially formed material that is deposited within the recess for the channel epitaxial wrap around layer 45b can be selected to overfill the recess. In some examples, the thickness of the thickness of the epitaxially formed material that is deposited within the recess for the channel epitaxial wrap around layer 45b can be selected to fill the recess. In one example, the thickness of the thickness of the epitaxially formed material that is deposited within the recess for the channel epitaxial wrap around layer 45b may be as thick as 10 nm. In one example, the thickness of the thickness of the epitaxially formed material that is deposited within the recess for the channel epitaxial wrap around layer 45b ranges from 1 nm to 4 nm.

The channel epitaxial wrap around layer 45b can be a material layer that is continuous and extends along an entirety of the height of a first sidewall S1 for the fin structure 15, is present along an entirety of the fin structures upper surface U1, and extends along an entirety of the height of the second sidewall S2.

In one embodiment, process flow depicted in FIGS. 8A-8C which can include a recess having a depth ranging from 1 nm to 2 nm, and a channel epitaxial wrap around layer 45b having a thickness within the recess ranging from 1 nm to 4 nm, can maintain the fin size and change only the threshold voltage (Vt). There are two methods to change the threshold voltage (Vt). In one method, due to a change in the size of the fin structure, the threshold voltage will be changed. For example, a larger Fin size, will lower the threshold voltage, which can favor a reduction of the gate induced drain leakage (GIDL). The formation of the channel epitaxial wrap around layers 45a, 45b can increase the fin size. In another method, due to changes in material, e.g., the incorporation of different semiconductor materials in the channel epitaxial wrap around layers 45a, 45b, the band alignment will be changed, which can lead to a threshold voltage (Vt) change. Changes in the threshold voltage resulting from the channel epitaxial wrap around layers 45a, 45b can reduce the gate induced drain leakage.

FIGS. 9A-9C depict removing the sacrificial gate structure 25. The sacrificial gate structure 25 may be removed by an etch that is selective to the fin structures 15, the outside dielectric spacer 33, and the interlevel dielectric layer 50. Removing the sacrificial gate structure 25 provides a gate structure opening to the channel region portion of the fin structures 15, as well as the channel epitaxial wrap around layer 45a. The functional gate structure is formed in the gate structure opening.

Although FIGS. 9A-10C depict the channel epitaxial wrap around layer 45a that has been described above with reference to FIGS. 7A-7C, the process flow that is described with reference to FIGS. 9A-10C is equally applicable to the embodiments of the present disclosure that include the channel epitaxial wrap around layer 45b that has been formed using the process sequence described with reference to FIGS. 8A-8C.

FIGS. 9A and 9B depict removing the sacrificial gate structure 25 to provide a gate opening 21 to a channel region portion of the fin structure 15. The sacrificial gate structure 25 may be removed using a selective etch process. In some embodiments, the sacrificial gate structure 25 may be removed by an anisotropic etch, such as reactive ion etching, or a wet etch. The channel epitaxial wrap around layer 45a is within the gate opening 21.

Figure 10C:
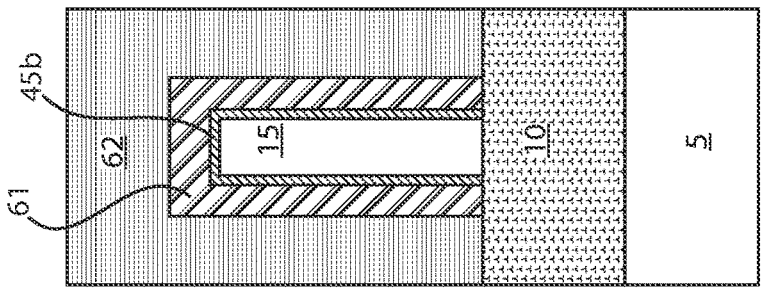
FIG. 10C is a side cross-sectional view along section line c-c of FIG. 10A. a side cross-sectional view along section line c-c of FIG. 10A.
Figure 10B:
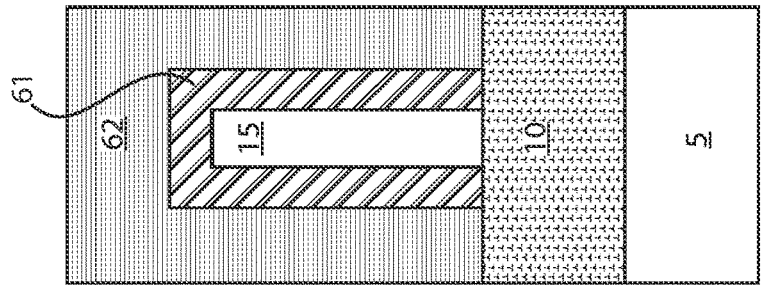
FIG. 10B is a side cross-sectional view along section line b-b of FIG. 10A.
Figure 10A:
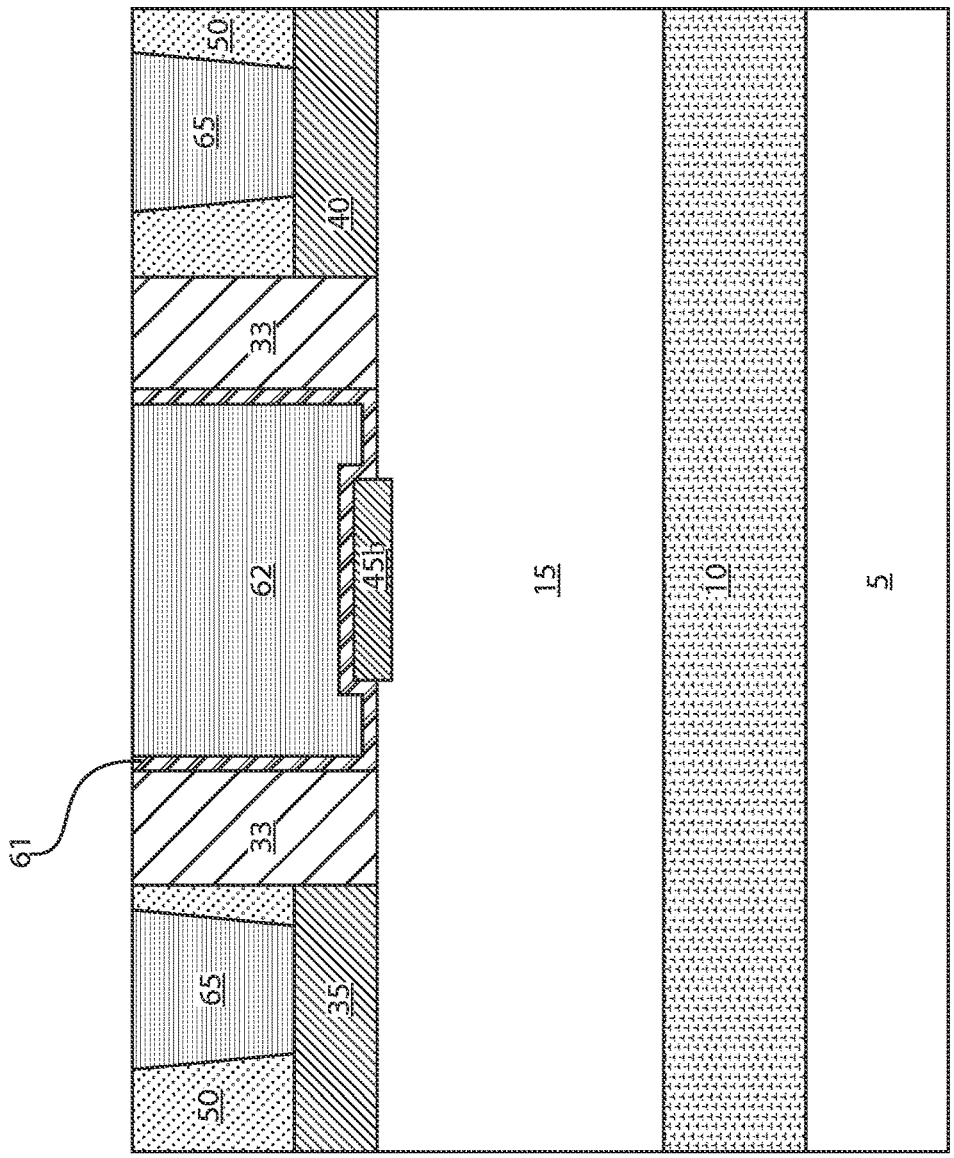
FIG. 10A is a side cross-sectional view depicting forming a functional gate structure in the gate opening that is formed by removing the sacrificial gate structure, in accordance with one embodiment of the present disclosure.

FIGS. 10A-10C depict forming a functional gate structure 60 in the gate opening 21 that is formed by removing the sacrificial gate structure 25.

FIGS. 10A-10C depict forming a high-k dielectric material layer 61 on the gate opening 21 that is depicted in FIGS. 9A-9C. The high-k dielectric material layer 61 is formed in direct contact with the channel epitaxial wrap around layer 45a. High-k dielectric materials, such as those used in the high-k dielectric material layer 61, have a dielectric constant greater than silicon oxide ($SiO_2$). For example, high-k dielectrics having a dielectric constant greater than 4.0 at room temperature, e.g., 20° C. to 25° C. and atmospheric pressure, e.g., 1 atm. In one embodiment, the high-k dielectric material layer 61 is composed of a high-k oxide such as, for example, $HfO_2$, $ZrO_2$, $Al_2O_3$, $TiO_2$, $La_2O_3$, $SrTiO_3$, $LaAlO_3$, $Y_2O_3$ and mixtures thereof. Other examples of high-k dielectric materials for the high-k dielectric material layer 61 include hafnium silicate, hafnium silicon oxynitride or combinations thereof.

In one embodiment, the high-k dielectric material layer 61 is formed on the horizontally orientated upper surface U1 and vertically orientated sidewall surfaces S1, S2 of the channel region portion of the fin structure 15 at which the channel epitaxial wrap around layer 45a is not present. The high-k dielectric material layer 61 is also formed on the vertically orientated sidewall surfaces of the outside dielectric spacer 33.

In one embodiment, the high-k dielectric material layer 61 may be deposited by chemical vapor deposition (CVD). Variations of CVD processes suitable for depositing the at least one gate dielectric layer include, but are not limited to, atmospheric pressure chemical vapor deposition (APCVD), low pressure chemical vapor deposition (LPCVD), plasma enhanced chemical vapor deposition (PECVD), metal organic chemical vapor deposition (MOCVD), atomic layer deposition (ALD), and combinations thereof. In other embodiments, the high-k dielectric material layer 61 is deposited by atomic layer deposition.

The high-k dielectric material layer 61 can be deposited having a conformal thickness. In one embodiment, the thickness of the high-k dielectric material layer 61 is greater than 0.8 nm. More typically, the high-k dielectric material layer 61 has a thickness ranging from about 1.0 nm to about 6.0 nm.

In some embodiments, a planarization process removes any deposited material for the high-k dielectric material that may have been deposited outside the gate opening 21. For example, a planarization process can remove the portion of the high-k dielectric material layer 61 that is present on the upper surface of the intralevel dielectric 50.

FIGS. 10A and 10B depict depositing a gate electrode 62, e.g., a metal gate electrode, in the gate opening 21. In some embodiment, a deposited metal provides the gate electrode 62 of a functional gate structure. The "functional gate structure" operates to switch the semiconductor device from an "on" to "off" state, and vice versa. The functional gate structure typically includes at least on gate dielectric and at least one gate electrode. The high-k dielectric material layer 61 provides the gate dielectric of a functional gate structure.

In some embodiments, the metal for the gate electrode 62 may be a p-type work function metal layer. As used herein, a "p-type work function metal layer" is a metal layer that effectuates a p-type threshold voltage shift. As used herein, "threshold voltage" is the lowest attainable gate voltage that will turn on a semiconductor device, e.g., transistor, by making the channel of the device conductive. The term "p-type threshold voltage shift" as used herein means a shift in the Fermi energy of a p-type semiconductor device towards a valence band of silicon in the silicon containing substrate of the p-type semiconductor device. A "valence band" is the highest range of electron energies where electrons are normally present at absolute zero. In one embodiment, the p-type work function metal layer may be composed of titanium and their nitrided/carbide. In one embodiment, the p-type work function metal layer is composed of titanium nitride (TiN). Therefore, in some embodiments the metal may be titanium nitride (TiN), and may provide a p-type work function layer. In some other embodiments, the p-type work function metal layer is provided by a meal that is composed of TiAlN, Ru, Pt, Mo, Co and alloys and combinations thereof.

In some other embodiments, the metal for the gate electrode 62 may be an n-type work function metal layer. As used herein, an "n-type work function metal layer" is a metal layer that effectuates an n-type threshold voltage shift. "N-type threshold voltage shift" as used herein means a shift in the Fermi energy of an n-type semiconductor device towards a conduction band of silicon in a silicon-containing substrate of the n-type semiconductor device. The "conduction band" is the lowest lying electron energy band of the doped material that is not completely filled with electrons. In some embodiments, the n-type work function metal layer that provides the metal 60 is composed of at least one of TiAl, TaN, TiN, HfN, HfSi, or combinations thereof.

The metal for the gate electrode 62 may be formed using a deposition process. The metal may fill the gate opening 21. In some embodiments, the metal is formed using a physical vapor deposition (PVD) process, such as sputtering. Examples of sputtering apparatus that may be suitable for depositing the at least one gate conductor include DC diode type systems, radio frequency (RF) sputtering, magnetron sputtering, and ionized metal plasma (IMP) sputtering.

FIGS. 10a-10C also depict forming source and drain contacts 65 to the epitaxial semiconductor material 35, 40. Forming the contacts 65 may include forming via openings in the interlevel dielectric 50 to the epitaxial material of the source and drain regions 35, 40, and filling the via openings with metal to provide the contacts 65.

FIGS. 10A-10C depict a semiconductor device that includes a channel epitaxial wrap around layer 45a, 45b at each end of the channel for the fin structure 15 that minimizes and/or eliminates the incidence of gate induced drain leakage (GIDL). In one embodiment, the semiconductor device includes a fin structure 15; a channel epitaxial wrap around layer 45a, 45b at each end of a channel portion of the fin structure 15; and a gate structure 60. The gate structure 60 including a gate dielectric 61 having end portions in direct contact with the channel epitaxial wrap around layer 45a, 45b at said end of the channel portion, and a middle portion of the gate dielectric 61 is in direct contact with the fin structure 15 at a portion between said each end of the channel portion. In some embodiments, source and drain regions 35, 40 on portions of the fin structure 15 that are on opposing sides of the channel portion; and spacers 33 are present separating the gate structure 60 from source and drain regions 35, 40.

In some embodiments, the fin structure 15 is composed of silicon (Si), and the source and drain regions 35, 40 are n-type doped, the channel epitaxial wrap around layer 45a, 45b is composed of silicon doped with carbon (Si:C).

In some embodiments, the fin structure 15 is composed of silicon (Si), and the source and drain regions 35, 40 are p-type, the channel epitaxial wrap around layer is composed of silicon germanium (SiGe).

The methods and structures that have been described above with reference to FIGS. 1-10C may be employed in any electrical device including integrated circuit chips. The integrated circuit chips including the disclosed structures and formed using the disclosed methods may be integrated with other chips, discrete circuit elements, and/or other signal processing devices as part of either (a) an intermediate product, such as a motherboard, or (b) an end product. The end product can be any product that includes integrated circuit chips, including computer products or devices having a display, a keyboard or other input device, and a central processor.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

While the methods and structures of the present disclosure have been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A semiconductor device comprising:
  a fin structure;
  a channel epitaxial wrap around layer at each end of a channel portion of the fin structure;
  a gate structure including a gate dielectric having gate edge portions in direct contact with the channel epitaxial wrap around layer, wherein a middle portion of the gate dielectric is in direct contact with a central channel portion of the fin structure, the central channel portion of the fin structure being between said each end of the channel portion of the fin structure, the channel epitaxial wrap around layer atop the central channel portion and not extending onto said each end of the channel portion; and
  source and drain regions on opposing sides of the channel portion of the fin structure.

2. The semiconductor device of claim 1 further comprising spacers separating the gate structure from the source and drain regions.

3. The semiconductor device of claim 1, wherein the fin structure is composed of silicon (Si), the source and drain regions are n-type doped, and channel epitaxial wrap around layer is comprised of silicon doped with carbon (Si:C).

4. The semiconductor device of claim 1, wherein the fin structure is composed of silicon (Si), the source and drain region are p-type, and the channel epitaxial wrap around layer is comprised of silicon germanium (SiGe).

5. The semiconductor device of claim 1, wherein the channel epitaxial wrap around layer has a conformal thickness.

6. The semiconductor device of claim 1, wherein the channel epitaxial wrap around layer is a continuous material layer present on an upper surface of the fin structure and is present along each sidewall of the fin structure.

7. The semiconductor device of claim 1, wherein the source and drain regions are comprised of an epitaxial semiconductor material in direct contact with portions of the fin structure on said opposing sides of the channel portion of the fin structure.

8. The semiconductor device of claim 1, wherein the channel epitaxial wrap around layer reduces gate induced drain leakage (GIDL).

9. A semiconductor device comprising:
  a pedestal of a first semiconductor material including a channel region between a source region and a drain region;
  a channel wrap around layer of a second semiconductor material in direct contact with the pedestal of the first semiconductor material; and
  a gate structure including a gate dielectric having end portions in direct contact with the channel wrap around layer, wherein a middle portion of the gate dielectric is in direct contact with a central portion of the channel region, the central portion of the channel region being between said each end of the channel region of the pedestal of the first semiconductor material, wherein the channel wrap around layer is atop the central portion of the channel region and is not extending onto each end of the channel portion.

10. The semiconductor device of claim 9, wherein when the first semiconductor material is comprised of silicon (Si), the source and drain regions are n-type doped, and second semiconductor material of the channel wrap around layer is comprised of silicon doped with carbon (Si:C).

11. The semiconductor device of claim 9, wherein the first semiconductor material is comprised of silicon (Si), the source and drain region are p-type, and the second semiconductor material of the channel wrap around layer is comprised of silicon germanium (SiGe).

12. The semiconductor device of claim 9, wherein the channel wrap around layer has a conformal thickness.

13. The semiconductor device of claim 9, wherein the channel wrap around layer is a continuous material layer present on an upper surface of the pedestal and is present along each sidewall of the pedestal.

14. The semiconductor device of claim 9, wherein the channel wrap around layer reduces gate induced drain leakage (GIDL).

15. A method of forming a semiconductor device comprising:
   forming an inner dielectric spacer and outer dielectric spacer combination structure on a sacrificial gate structure that is present on a fin structure, wherein the inner dielectric spacer and outer dielectric spacer combination structure separates source and drain regions from the sacrificial gate structure;
   removing the inner sidewall dielectric spacer;
   forming a channel epitaxial wrap around layer on the portion of the fin structure that is exposed by removing the inner sidewall dielectric spacer;
   removing the sacrificial gate structure to provide a gate opening to a channel portion of the fin structure, wherein the gate opening exposes the channel epitaxial wrap around layer, the channel wrap around layer is atop the central portion of the channel region and is not extending onto said each end of the channel portion; and
   forming a functional gate structure within the gate opening.

16. The method of claim 15, wherein the channel epitaxial wrap around layer is present on sidewall and upper surfaces of the fin structure within the gate opening.

17. The method of claim 15, wherein the channel epitaxial wrap around layer is a continuous and conformal epitaxially formed layer.

18. The method of claim 15, wherein the channel epitaxial wrap around layer reduces gate induced drain leakage (GIDL).

19. The method of claim 15, wherein the channel epitaxial wrap around layer is formed directly on an exterior surface of the fin structure.

20. The method of claim 15, wherein forming the channel epitaxial wrap around layer comprises:
   forming a recess in the portion of the fin structure that is exposed by removing the inner sidewall dielectric spacer;
   forming a channel epitaxial wrap around layer in the recess on the portion of the fin structure that is exposed by removing the inner sidewall dielectric spacer.

* * * * *